United States Patent [19]

Kosa

[11] 4,079,504

[45] Mar. 21, 1978

[54] METHOD FOR FABRICATION OF N-CHANNEL MIS DEVICE

[75] Inventor: Yasunobu Kosa, Kodaira, Japan

[73] Assignee: Hitachi, Ltd., Japan

[21] Appl. No.: 685,530

[22] Filed: May 11, 1976

[30] Foreign Application Priority Data

Jun. 4, 1975 Japan .................................. 50-66551

[51] Int. Cl.² .............................................. B01J 17/00
[52] U.S. Cl. ........................................ 29/571; 29/578; 29/590; 148/187
[58] Field of Search .................... 29/571, 578, 590; 148/187

[56] References Cited

U.S. PATENT DOCUMENTS

| 3,909,320 | 9/1975 | Cauge ........................... 148/187 |
| 3,986,903 | 10/1976 | Watrous ........................ 148/187 |

Primary Examiner—W. Tupman
Attorney, Agent, or Firm—Craig & Antonelli

[57] ABSTRACT

A method for fabrication of an n-channel MIS device is composed of forming a source region and a drain region in the surface of a p-type semiconductor substrate by the diffusion of a first n-type impurity through a mask pattern including an insulator gate film, forming a first silicate glass film on the surface of the resultant substrate, providing windows for source, drain and gate contacts in the first silicate glass film, diffusing a second n-type impurity through the windows for source and drain contacts to form n-type high impurity concentration regions, selectively removing a second silicate glass film formed simultaneously with the diffusion of the second n-type impurity while leaving the portions of the second silicate glass film except at least the windows for source, drain and gate contacts, and providing metal contacts in the windows.

3 Claims, 16 Drawing Figures

METHOD FOR FABRICATION OF N-CHANNEL MIS DEVICE

BACKGROUND OF THE INVENTION

1. Field of the Invention

This invention relates to a method for fabrication of an n-channel MIS (Metal-Insulator-Semiconductor) device.

2. Description of the Prior Art

A typical type of conventional n-channel MIS device is fabricated as follows. A film of $SiO_2$ is formed on the surface of a p-type semiconductor substrate through thermal oxidation and the $SiO_2$ film is partially removed on the parts of the surface of the substrate where source, drain and gate contacts are to be provided. A new thin film of $SiO_2$ is formed on the substrate through thermal oxidation and a polycrystalline silicon film is formed on the second $SiO_2$ film through CVD (Chemical Vapor Deposition) method. The polycrystalline silicon film is selectively removed, leaving the parts thereof serving as a gate and other desired areas. The $SiO_2$ film is selectively removed to form windows through which source and drain regions are to be formed. By using the remaining $SiO_2$ and polycrystalline silicon films as a mask, phosphorus (P) as an n-type impurity is diffused into the exposed surface of the substrate to form source and drain regions. Through the CVD method, a PSG (glass including phosphoric oxide, called phospho-silicate glass) film is formed on the entire upper surface of the resultant substrate. In the phosphosilicate glass film are formed windows for forming source, drain and gate contacts. Aluminum (Al) is vapor-deposited on the upper surface of the substrate and the vapor-deposited Al film is selectively removed to complete Al contacts connected respectively with the source region, drain region and gate.

However, the n-channel MIS device fabricated according to the above-described method will raise the following problems.

Those surfaces of the source and drain regions in the semiconductor substrate which are in direct contact with the Al contacts tend to become p-type layers since Al diffuses into the surfaces during the process of forming the Al contacts. Accordingly, in the case where the surface impurity concentration in the source and the drain regions which are of n-type is comparatively low, i.e. below $5 \times 10^{20} cm^{-3}$, the change of the source and drain regions from n-type to p-type regions gives rise to the characteristic of a diode, which will cause in turn the degradation of reliability of the resultant device and the reduction of the yield in production.

Moreover, in the case of fabricating an MIS device in which the channel length, i.e. the distance between the source and drain regions, is relatively short, the positions of the windows for the Al contacts deviate easily in the process of forming the windows and the $SiO_2$ film beneath the phospho-silicate glass film may be accordingly exposed. The Al contacts may be therefore so disposed as to be in direct contact with the $SiO_2$ film. If the Al contacts are in direct contact with the $SiO_2$ film, sodium ions ($Na^+$) and potassium ions ($K^+$) contained in the Al contacts penetrated into the $SiO_2$ film so that the $SiO_2$ film is contaminated with $Na^+$ and $K^+$ ions. Accordingly, the surface of the substrate is changed to $n^+$-type region so that the reliability of the resultant device is degraded.

Further, in the process of forming the windows for Al contacts, the positions of windows sometimes deviate to make the p-type substrate exposed. In such a case, if the Al contacts are disposed in the windows, the Al contacts may connect the n-type source or drain region with the p-type substrate to cause an inferiority in characteristic (decrease in breakdown voltage).

SUMMARY OF THE INVENTION

One object of this invention is to provide an n-channel MIS device in which the upper portions of the source and drain regions are prevented from being changed to p-type regions so that a high reliability may be attained.

Another object of this invention is to provide an n-channel MIS device in which the conductivity type of the surface of the semiconductor substrate is prevented from being inverted so that a high reliability can be obtained.

Yet another object of this invention is to provide an n-channel MIS device in which the Al electrodes are prevented from being in contact with both the p-type substrate and the n-type source or drain region.

A method for fabrication of an n-channel MIS device according to this invention comprises forming a source region and a drain region in the surface of a p-type semiconductor substrate by the diffusion of a n-type impurity through a mask pattern including an insulator gate film, forming a silicate glass film on the upper surface of the resultant substrate, and forming in the silicate glass film windows for source, drain and gate contacts. The improvement in the method according to this invention lies in that a second n-type impurity is diffused through the windows for source and drain contacts to form n-type high impurity concentration layers in at least parts of the surfaces of the source and the drain regions, a second silicate glass film being formed on the surface of the resultant substrate simultaneously with the diffusion of the second n-type impurity, and that the second silicate glass film is selectively removed while leaving the portions of the second silicate glass film except at least the windows for source, drain and gate contacts in windows, metal contacts being thereafter provided in the windows.

Since the n-type high impurity concentration regions are formed in the surface portions of the n-type drain and source regions, the surfaces of the drain and source regions are prevented from being changed to p-type regions even if any impurity of the metal used as contacts is diffused into the surfaces in the formation of the metal contacts.

It is preferable to remove those portions of the second silicate glass film which are at the bottoms of the windows for source and drain contacts, but to leave those portions of the film which are at the walls of the windows for source and drain contacts. In that case, since the insulator film for the gate and other purposes are covered by the second silicate glass film, even if the positions of the windows deviate, any impurity contained in the metal used as contacts can be prevented from entering into the insulator film to contaminate the insulator film and to therefore invert the conductivity type of the substrate surface.

Moreover, since the n-type high impurity concentration regions are formed through the windows for source and drain contacts, the characteristic degradation (decrease in breakdown voltage) due to the connection of the metal contact with the substrate surface other than the source and drain regions owing to the deviation of the positions of the windows, can be prevented.

DESCRIPTION OF THE PREFERRED EMBODIMENTS

FIGS. 1A to 1J show in cross section the successive steps of an embodiment of a method for fabrication of n-channel MIS device according to this invention.

Figure 1A:
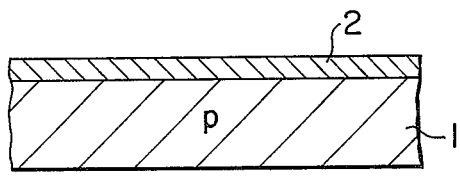
FIGS. 1A to 1J show in longitudinal cross section the steps of an embodiment of a method for fabrication of n-channel MIS device according to this invention.

As seen in FIG. 1A, a p-type semiconductor substrate 1 is prepared and an oxide film (SiO$_2$ film) 2 having a thickness of about 1 to 1.5 $\mu$ is formed in the upper surface of the substrate 1 through thermal oxidation. The thickness of the semiconductor substrate 1 may be 200 to 300 $\mu$. As seen in FIG. 1B, the SiO$_2$ film 2 is selectively removed to expose the portions of the surface of the substrate where a source region, a drain region and a gate are to be formed, through photoetching. As seen in FIG. 1C, an oxide film (SiO$_2$ film) 2a for the gate is formed in the exposed surface of the substrate 1 through thermal oxidation. The thickness of the SiO$_2$ film 2a may be 500 to 1000A. The last oxidation treatment also adds to the thickness of the SiO$_2$ film 2. As shown in FIG. 1D, a polycrystalline silicon film 3 is formed on the SiO$_2$ films 2 and 2a through the well-known CVD (Chemical Vapor Deposition) method. The thickness of this polycrystalline silicon film 3 may be 3000 to 5000A. As shown in FIG. 1E, the polycrystalline silicon film 3 except the portions thereof serving as resistors or lying on the oxide film 2a for the gate, are selectively removed through etching and the SiO$_2$ film 2a is partially removed to provide windows 4a and 4b for forming the source and drain regions.

Figure 1F:
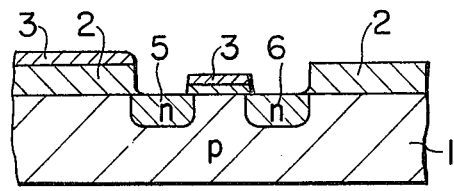
Figure 1B:
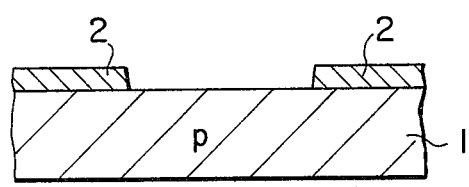
Figure 1G:
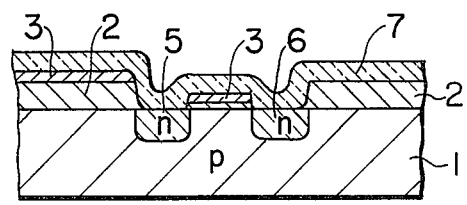
Figure 1C:
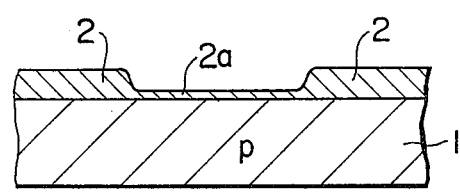
Figure 1H:
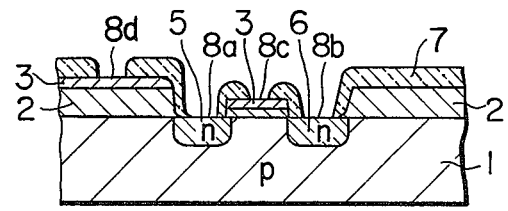
Figure 1D:
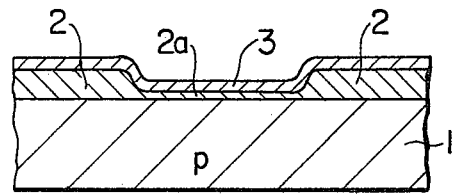

As is shown in FIG. 1F, with the SiO$_2$ film 2 and the polycrystalline silicon film 3 used as a mask, phosphorus (P) as an n-type impurity is diffused into the substrate 1 to form a source region 5 and a drain region 6 in the exposed surface of the substrate 1. Simultaneously with this diffusion process, a phospho-silicate glass (PSG) film is formed on the entire surface of the substrate 1 and the glass film is completely removed after the diffusion process. Then, as seen in FIG. 1G, a thick phospho-silicate glass film 7 is again formed on the entire surface of the substrate 1 through the CVD method. The thickness of the glass film 7 may be 5000A to 1$\mu$. It is preferable for the improvement of closeness in contact to perform an anyl treatment in an atmosphere of nitrogen (N$_2$) gas. As shown in FIG. 1H, the phospho-silicate glass film 7 is then selectively removed to form windows 8a, 8b, 8c and 8d for source, drain, gate and resistor contacts.

Figure 1I:
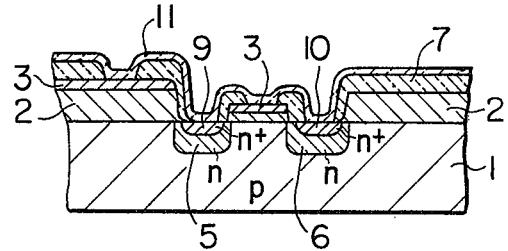
Figure 1E:
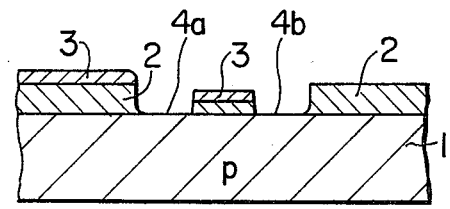

As shown in FIG. 1I, phosphorus (P) is diffused into the surfaces of the source region 5 and the drain region 6 by use of the phospho-silicate glass film 7 as a mask, so that n-type high impurity concentration regions 9 and 10 are formed in the surfaces of the regions 5 and 6. The surface impurity concentrations of the n-type high impurity concentration regions are, for example, 5 $\times$ 10$^{20}$cm$^{-3}$ to 1.5 $\times$ 10$^{21}$cm$^{-3}$. Simultaneously with this diffusion of phosphorus, a phospho-silicate glass film 11 having a thickness of 100 to 500A is formed on the exposed surface of the substrate 1 while a phospho-silicate glass film 11 having a thickness of 400 to 1000A is formed on the phospho-silicate glass film 7.

Figure 1J:
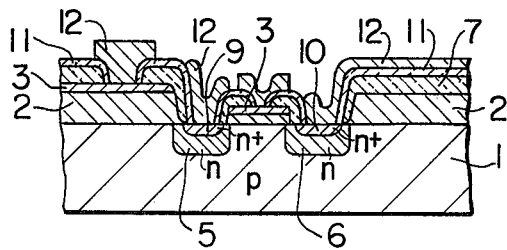

As shown in FIG. 1J, by using a suitable etching solution such as fluoride solution containing HF and NH$_4$F in the proportion of 1 : 6 (volume ratio) or 10% of HF, the phospho-silicate glass film 11 is so etched that the thin glass film 11 at the bottoms of the windows 8a, 8b, 8c and 8d may be removed while a thin glass layer 11 is retained on the other surface. Thereafter, metal layer for contacts such as Al layer is formed on the entire surface of the substrate 1 through vapor-evaporation. The metal layer is selectively removed to form metal contacts 12 connected with the source region 5, the drain region 6, the gate 3 and the polycrystalline silicon film 3 serving as a resistor. Thus, an n-channel MIS device according to this invention is completed.

As is seen in FIG. 1J, the phospho-silicate glass film 11 is left at the walls of the windows 8a, 8b, 8c and 8d. However, these portions of the glass film 11 may be etched off.

Moreover, in the steps shown in FIGS. 1A to 1C, a SiO$_2$ film is as used as insulator film. However, the insulator film may include an Si$_3$N$_4$ film or a double layer of an SiO$_2$ film and an Si$_3$N$_4$ film, as is well known to those skilled in the art.

Figure 2A:
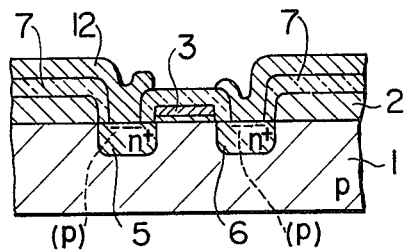
FIGS. 2A to 4B are the longitudinal cross sections of the principal portions of n-channel MIS devices fabricated according to a conventional method and the method of this invention, FIGS. 2A, 3A and 4A corresponding to the steps of the conventional method and FIGS. 2B, 3B and 4B corresponding to the steps of the method of this invention.
Figure 2B:
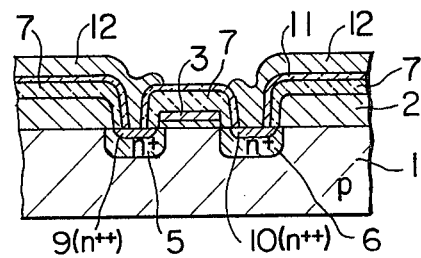
Figure 3A:
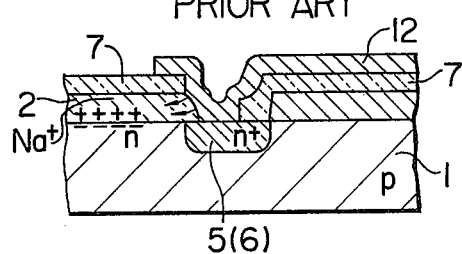
Figure 3B:
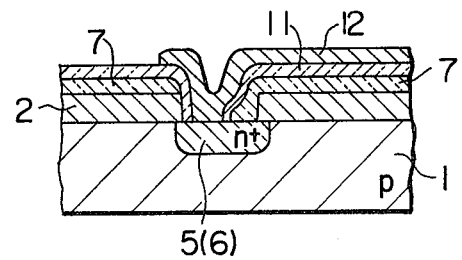
Figure 4A:
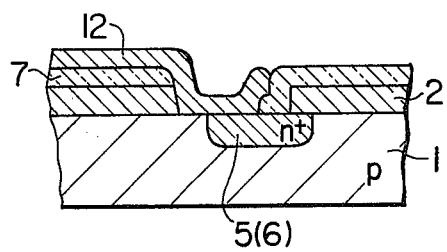
Figure 4B:
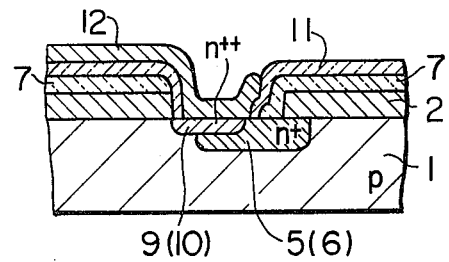

Now, the effects obtained by the method according to this invention will be described in comparison with the conventional method with the aid of FIGS. 2A to 4B. FIGS. 2A, 3A and 4A are the longitudinal cross sections of principal portions of an n-channel MIS device fabricated according to a conventional method and FIGS. 2B, 3B and 4B are the longitudinal cross sections of principal portions of an n-channel MIS device fabricated according to this invention. The same reference numerals are applied to like parts or equivalent components throughout the figures. It should be noted that the conventional method lacks the formation of n-type high impurity concentration regions and the simultaneous formation of a second phospho-silicate glass film as included in the method according to this invention.

As is shown in FIG. 2A, according to the conventional method, if the surface impurity concentrations of the source and the drain regions 5 and 6 are relatively low, i.e. below 5 $\times$ 10$^{20}$cm$^{-3}$, the surface of the regions 5 and 6 are changed to p-type regions due to the diffusion of Al (serving as p-type impurity) during the process of forming the Al contacts. On the other hand, as is shown in FIG. 2B, according to this invention, the n-type high impurity concentration regions 9 and 10 are formed by diffusing an n-type impurity into the surfaces of the source and the drain regions 5 and 6 so that the conductivity types of the surfaces of the source and the drain regions 5 and 6 are not inverted even if Al (serving as p-type impurity) is diffused into the surfaces. Accordingly, the regions 5 and 6 can be prevented from having characteristics like that of a diode, the resultant n-channel MIS device can enjoy a high reliability, and moreover the yield in production can be improved. It will also be apparent that the above-described effect of this invention can be obtained without those portions of the phospho-silicate glass film 11 which are on the walls of the windows for contacts.

According to the conventional method as shown in FIG. 3A, due to the deviation of the positions of the windows, the Al contacts 12 are brought into contact with the SiO$_2$ film 2. Accordingly, the Na$^+$ and K$^+$ ions contained in the Al contacts 12 penetrate into the SiO$_2$ film so that the conductivity of the surface of the substrate is sometimes inverted. According to this invention as shown in FIG. 3B, however, the second phospho-silicate glass film 11 is formed and left on the walls of the windows, as in the preferred embodiment of this invention, to isolate the Al contacts from the SiO$_2$ film. Accordingly, even if the positions of the windows deviate and the SiO$_2$ film is partially exposed, the Na$^+$ and K$^+$ ions are prevented from penetrating into the SiO$_2$ film by means of the second phospho-silicate glass film so that the inversion of the conductivity type of the substrate surface is prevented and the reliability of the resultant device is improved.

According to the conventional method as shown in FIG. 4A, if the positions of the windows deviate, the Al contacts are in contact not only with the n-type source or drain regions, but also with the p-type semiconductor substrate so that the breakdown voltage is decreased. On the other hand, according to this invention as shown in FIG. 4B, even if the surface of the p-type substrate is exposed due to the deviation of the positions of the windows, the exposed parts of the substrate surface (belonging respectively to the source and the drain regions) are thereafter changed to n-type high impurity concentration regions so that the Al contacts are isolated from the p-type semiconductor substrate to prevent the degradation of characteristic (decrease in breakdown voltage).

Although the foregoing description has been made to the use of phosphorus as the n-type impurity and the formation of a phospho-silicate glass film, if another n-type impurity is used, a silicate glass of that impurity is formed.

In the above embodiments, description has been made solely of the MIS devices using SiO$_2$ or Si$_3$N$_4$ film as an insulator layer, but this invention is by no means limited to this type alone. For example, a thin film of molybdenum oxide may be used as an insulator layer. This invention can be generally applied to the fabrication of n-channel MIS devices.

I claim:

1. A method for fabrication of an n-channel MIS device comprising:
    a step of forming a predetermined insulator film on a selected area of the upper surface of a p-type semiconductor excepting first and second sections in which source and drain regions are to be formed respectively and including at least a third section in which a channel between the source and drain regions is to be provided, the portion of said insulator film on said third section providing a gate;
    a step of diffusing a first n-type impurity in said first and second sections of said substrate by use of said insulator film as a mask to form source and drain regions therein respectively;
    a step of forming a first silicate glass film on an upper surface of the resultant substrate;
    a step of forming first, second and third windows in those portions of said first silicate glass film the respective parts of which correspond to said source region, said drain region and said gate;
    a step of diffusing a second n-type impurity through said first and second windows to form n-type high impurity concentration regions respectively in the surface portions of the substrate exposed by said first and second windows, a second silicate glass film being simultaneously formed on an upper surface of the resultant substrate, the thickness of a portion of said second silicate glass film formed on said first silicate glass film being larger than that of a portion of said second silicate glass film formed on said source and drain regions; and
    a step of providing metal contacts in said first, second and third windows respectively.

2. In a method for fabricating an n-channel MIS device comprising the steps of:
    (a) selectively forming a predetermined insulator film on a selected area of the upper surface of a p-type semiconductor except for first and second surface portions in which source and drain regions are to be respectively formed and including at least a third surface portion in which a channel between the source and drain regions is to be provided, the portion of said insulator film on said third surface portion providing a gate insulator film;
    (b) introducing a first n-type impurity into said first and second surface portions of said substrate by using said insulator film as a mask so as to form source and drain regions respectively therein; and
    (c) forming a first silicate glass film on an upper surface of the resultant substrate;
    the improvement comprising the combination of steps for providing metal contacts for the source, drain and gate of said MIS device, while preventing a change in the conductivity characteristics of the source and drain regions as well as the introduction of impurities into said predetermined insulator film comprising the steps of
    (d) forming first, second and third windows in those portions of said first silicate glass film the respective parts of which correspond to said source region, said drain region and said gate insulator film;
    (e) introducing a second n-type impurity through said first and second windows to form n-type high impurity concentration regions respectively in the surface portions of the substrate exposed by said first and second windows, a second silicate glass film being simultaneously formed on an upper surface of the resulant substrate;
    (f) selectively removing said second silicate glass film, leaving at least those portions of said second silicate glass film which lie on the upper surface portions of the substrate and on side wall portions of said first, second and third windows in said first silicate glass film; and
    (g) providing metal contacts in said first, second and third windows respectively.

3. The improvement according to claim 2, wherein said first and second silicate glass films are phosphosilicate glass films.

* * * * *